Jan. 15, 1963

T. C. T. NEW

METHOD AND APPARATUS FOR THE FABRICATION OF ALLOYED TRANSISTORS

Filed Sept. 16, 1958

3,073,006

WITNESSES:

Leon M. Garman

Charles L. Menzgemer

INVENTOR

Thorndike C.T. New

BY

Frederick Shapoe

ATTORNEY

United States Patent Office 3,073,006

Patented Jan. 15, 1963

3,073,006

METHOD AND APPARATUS FOR THE FABRICATION OF ALLOYED TRANSISTORS

Thorndike C. T. New, Hempfield Township, Westmoreland County, Pa., assignor to Westinghouse Electric Corporation, East Pittsburgh, Pa., a corporation of Pennsylvania Filed Sept. 16, 1958, Ser. No. 761,402
2 Claims. (Cl. 29—25.3)

The present invention relates to the fabrication of junction-type semiconductor devices, and in particular, to methods and apparatus for producing such devices.

An object of the present invention is to provide improved apparatus for the formation of an alloyed junction-type semiconductor device having accurately aligned electrodes and junctions.

Another object of the present invention is to provide a method for the manufacture of alloyed junction-type semiconductor devices having well defined and accurately aligned junctions on the opposite sides of a semiconductor wafer.

Other objects of the invention will, in part, be obvious and will, in part, appear hereinafter.

For a better understanding of the nature and objects of the invention, reference should be had to the following detailed description and drawing, in which.

Figure 1:
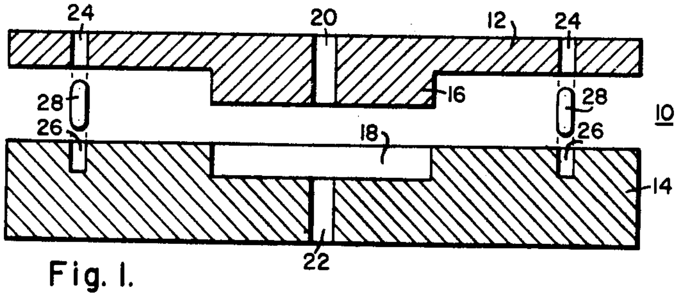
FIGURE 1 is a front view, in cross section, of one form of the apparatus utilized in this invention.

In accordance with the present invention and attainment of the foregoing objects there is provided apparatus for forming diffused junctions between a wafer of a semiconductive material and suitable alloying pellets, said apparatus comprising a top member and a base member, said base member having a depression or cavity capable of receiving and housing at least a portion of said top member, said top member having walls forming a protrusion, said protrusion extending downwardly toward the base member and fitting the depression in the base member, the walls of said top member forming a passageway therethrough which is of lesser cross section than said protrusion and being centrally disposed through said protrusion. The base member has walls forming a depression in the upper surface thereof, the wall of the depression forming a flat horizontal surface below the upper surface of the base member, and the cross-sectional area of said depression being sufficient to receive and house at least a portion of the protrusion of the top member. The base member is provided with a passageway centrally of the depression, the passageway being of lesser cross-sectional area than the depression. The passageway is so positioned that it is coaxial with the passageway in the top member when the protrusion of the top member is housed in the depression of the base member. The top member and the base member are of an inert refractory material capable of withstanding repeated temperature cycling.

In accordance with another aspect of this invetnion there is provided a method of manufacture of a semiconductor device comprising the steps of (1) coating at least one portion of at least one surface of a perforated base tab with a suitable solder, (2) stacking and positioning one surface of an N-type germanium wafer upon at least that portion of the base tab coated with solder, (3) disposing a first indium doping pellet centrally upon the other surface of the germanium wafer, (4) heating the stack and thereby melting both the solder disposed on the base tab and the indium alloying pellet to produce a P-N junction, (5) cooling the stack to form an integral body, (6) rotating the integral body 180°, (7) centrally disposing a second indium doping pellet upon the other surface of the germanium wafer, said pellet contacting said wafer through the perforation in the base tab, (8) heating the body to a temperature sufficient to alloy the indium pellet to the germanium wafer to produce second P-N junction, said last mentioned temperature not exceeding the temperature in step (4), (9) cooling the pellet and wafer to form an integral unit, (10) heating the indium alloy pellet to a temperature sufficient to soften it, but not sufficient to affect the pellet to wafer junction, (11) disposing a contact partially within the pellet coaxially with the pellet-wafer junction, (12) rotating the integral body 180°, (13) heating the first indium pellet to a temperature sufficient to soften it, but not sufficient to effect the pellet to wafer junction, (14) partially disposing a contact within the pellet coaxially with the pellet-wafer junction, and (15) cooling the pellet to bond the contact in position. The process results in a complete transistor member.

For reasons of clarity, the apparatus of the present invention will be described in conjunction with the fabrication of alloyed-junction transistor units comprising N-type germanium wafers and indium doping pellets applied thereto. However, it will be apparent that the apparatus finds equal utility in the manufacture of alloyed junction semiconductor devices using any suitable semiconductor wafers of the N- or P-type and any suitable alloying and doping material of opposite conductivity.

With reference to FIG. 1, there is provided an apparatus 10 for the assembly of semiconductor devices comprised of a top member 12 and a base member 14. The apparatus 10 should be comprised of a chemically inert material capable of withstanding repeated temperature cycling. The top member 12 has a protrusion 16 which fits into a depression 18 in the base member 14, said depression 18 being capable of receiving and housing said protrusion 16. A passageway 20 is centrally disposed through protrusion 16 and when top member 12 is received and housed in base member 14, said passageway 20 is coaxial with passageway 22 through said base member 14. The passageway 22 which is of lesser cross-section than depression 18 enters into the depression 18 at a point substantially in the center of depression 18. When top member 12 is housed in base member 14, passageway 20 is substantially an extension of passageway 22, and passageway 22 is essentially an extension of passageway 20. Top member 12 and base member 14 may have at least two more passageways 24 and 26, respectively, through which pins 28 may be passed to hold top member 12 in contact with the base member 14.

Figure 2:
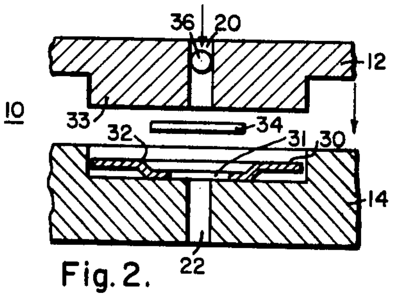
FIG. 2 is an exploded front view, in partial cross section, of one form of the apparatus of this invention with components of a semiconductor device in position for assembly.

With reference to FIG. 2, a base tab 30 which may be comprised of any suitable metal, for example, nickel is positioned in the depression of base member 14. It should be understood that while the base tab 30 is shown herein with a depressed center portion, it may be flat or of any other suitable configuration. At least a portion of the upper surface of the base tab 30 is coated with a suitable solder 32, for example, a lead-antimony-tin solder. A germanium wafer 34 is positioned upon the base tab 30, covering at least that portion of the base tab coated with solder. The top member 12 of the apparatus 10 is positioned in the depression 18 with the bottom surface 33 of the protrusion 16 in contact with the base tab 30 and the germanium wafer 34. An indium alloying pellet 36 is dropped through the passageway 20 of the top member 12 and comes in contact with the germanium wafer 34.

The entire assembly is placed within an appropriate furnace, not shown in the drawing, and the temperature of the assembly is raised above that of the melting point of the solder 32 and the indium pellet 36 by resistance radiant heating or the like. The apparatus is subjected to a heat in the temperature of 400° C. to 600° C. for a period of time of approximately 2 minutes whereby the solder 32 softens and wets the base tab 30 and the germanium wafer 34. The indium alloy pellet 36 melts and the molten indium dissolves the surface of the adjacent portion of the germanium wafer, and this dissolution continues until the liquid indium becomes saturated with germanium at the alloying temperature. The assembly is removed from the furnace and allowed to cool whereby the germanium wafer 34 is bonded intimately to the base tab 30. The germanium contained in the liquid indium at the other surface of the wafer precipitates on cooling upon the wafer such precipitated germanium being actuated with indium and being P-type. This causes the formation of P-type areas within the wafer at the surface contacted by the indium and produces P-N junctions between these areas and the N-type body of the wafer.

Figure 3:
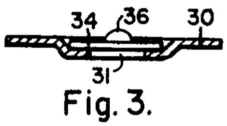
FIG. 3 is a front view of a semiconductor device, partly assembled in accordance with the procedure of this invention.
Figure 4:
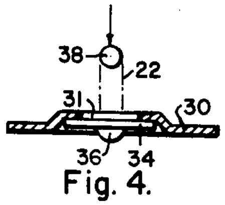
FIGS. 4, 5, 6, 7, 8 and 9 are front views of a semiconductor device, in various stages of the assembly procedure of this invention.
Figure 5:
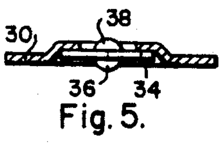

With reference to FIG. 3, the base tab 30 is shown bonded to one surface of the germanium wafer 34 and the indium pellet 36 is shown bonded to the other surface of the germanium wafer. The structure shown in FIG. 3 in the apparatus 10 is inverted as shown in FIG. 4. In the drawing, FIGS. 4 through 9 do not show the apparatus 10. A second indium pellet 38 is dropped through the passageway 22 and comes in contact with the wafer 34, through a passageway 31 in the base tab 30. The device is again fired to a temperature in the range of 400° C. to 600° C. for a period of time approximately 2 minutes whereby the indium pellet 38 melts and alloys with the wafer 34 as described above. The apparatus is then removed from the furnace and allowed to cool whereby indium pellet 38 forms a P-N junction with wafer 34 as described above with a resultant structure as shown in FIG. 5.

Figure 6:
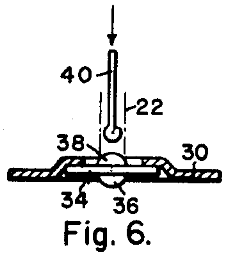

With reference to FIG. 6 a contact, for example, a lead wire 40, is then passed through the passageway 22 until it comes in contact with the indium pellet 38. The device is then charged into a furnace as of the type described above and heated to a temperature sufficient to soften the indium pellet but not of a temperature sufficient to affect the contact junction between the pellet 38 and the wafer 34. Satisfactory results have been achieved when a temperature in the range of 50° C. to 100° C. below the junction forming temperature is used. As the indium pellet softens, the lead wire 40 is disposed in the pellet 38. The device is then removed from the furnace after the pellet 38 is allowed to harden with the wire 40 in a position substantially perpendicular to the P-N pellet-wafer junction.

The P-N junction between the wafer 34 and the pellet 38 will not be affected by the connecting of the wire 40 unless it is subjected to a new equilibrium temperature and pressure that may cause at least a portion of the junction to pass back into the liquid phase. Therefore, the firing temperature should be equal or less than the temperature used to create the junction.

Figure 7:
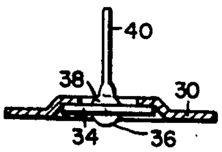
Figure 8:
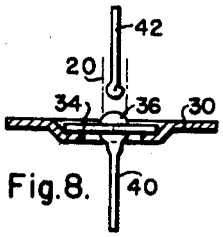

The semiconductor device at this point in its assembly is shown in FIG. 7.

Figure 9:
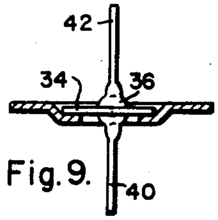

The semiconductor device of FIG. 7 is then inverted 180° with the apparatus 10. A second contact for example, a second lead wire 42 is inserted through passageway 20 in top member 12 of the apparatus 10 until it contacts the indium pellet 36. The device is then heated to a temperature sufficient to soften the indium pellet but not sufficient to effect the diffusion junction existing between the indium pellet 36 and the germanium wafer 34, for example, a temperature in the range of 50° C. to 100° C. below the lowest temperature of forming the junctions. As the indium pellet 36 softens, the wire 42 is embedded therein. The apparatus is then removed from the furnace and the semiconductor device allowed to cool whereby the wire 42 is held firmly in place by the hardened indium alloy pellet 36 with a resultant device as shown in FIG. 9.

Figure 10:
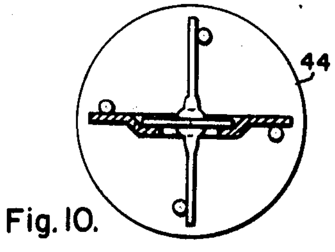
FIG. 10 is a front view of a semiconductor device prepared in accordance with this invention, mounted on a header for commercial use.

The semiconductor device thus prepared is now suitable for mounting to a header 44 as shown in FIG. 10, for encapsulation, or any of the other commercial mounting or potting methods known in the art.

Since certain changes in carrying out the above processes and in the product embodying the invention may be made without departing from its scope, it is intended that the accompanying description and drawing be interpreted as illustrative and not limiting.

I claim as my invention:

1. A method of manufacturing a semiconductor device comprising the steps (1) coating at least a portion of at least one surface of a perforated base tab with a suitable solder, (2) stacking and positioning one flat mon-planar surface of a wafer comprised of a semiconductive material upon at least that portion of the base tab coated with solder, (3) disposing a first doping alloy pellet centrally upon the other flat mon-planar surface of the wafer, (4) heating the stack, thereby melting both the solder disposed on the base tab and the doping alloy pellet to produce a P-N junction, (5) cooling the stack to form an integral body, (6) rotating the integral body 180°, (7) centrally disposing a second doping alloy pellet upon the other surface of the wafer, (8) heating the pellet and wafer to a temperature sufficient to alloy the doping alloy pellet to the wafer, (9) cooling the pellet and wafer to form an integral unit, (10) heating the doping alloy pellet to a temperature sufficient to soften it but not sufficient to effect the pellet to wafer junction, (11) disposing a contact within the pellet coaxially with the pellet-wafer junction, (12) rotating the integral stack 180°, (13) heating the first doping alloy pellet to a temperature sufficient to soften it but not sufficient to effect the pellet-wafer junction, (14) disposing a contact within the pellet coaxially with the pellet-wafer junction, and (15) cooling the pellet to bond the contact in position.

2. A method of manufacturing a semiconductor device comprising the steps (1) coating at least a portion of at least one surface of a perforated base tab with a suitable solder, (2) stacking and positioning one flat mon-planar surface of an N-type germanium wafer upon at least that portion of the base tab coated with solder, (3) disposing a first indium doping pellet centrally upon the other flat mon-planar surface of the germanium wafer, (4) heating the stack, thereby melting both the solder disposed on the base tab and the indium alloying pellet to produce a P-N junction, (5) cooling the stack to form an integral body, (6) rotating the integral body 180°, (7) centrally disposing a second indium doping pellet upon the other surface of the wafer, (8) heating the pellet and wafer to a temperature sufficient to alloy the indium alloy pellet to the wafer to produce a second P-N junction, said last mentioned temperature not exceeding the temperature in step (4), (9) cooling the pellet and wafer to form an integral unit, (10) heating the indium alloy pellet to a temperature sufficient to soften it but not sufficient to effect the pellet to wafer junction, (11) disposing a contact within the pellet coaxially with the pellet-wafer junction, (12) rotating the integral stack 180°, (13) heating the first indium pellet to a temperature sufficient to soften it but not sufficient to effect the pellet-wafer junction, (14) disposing a contact within the pellet coaxially with the pellet-wafer junction, and (15) cooling the pellet to bond the contact in position.

References Cited in the file of this patent

UNITED STATES PATENTS

| | | |
|---|---|---|
| 2,699,594 | Bowne | Jan. 18, 1955 |
| 2,743,693 | Schaper | May 1, 1956 |
| 2,757,324 | Pearson | July 31, 1956 |
| 2,796,563 | Ebers et al. | June 18, 1957 |
| 2,840,885 | Cressell | July 1, 1958 |
| 2,846,626 | Nowak | Aug. 5, 1958 |
| 2,862,470 | Williams | Dec. 2, 1958 |
| 2,939,205 | Sutherland et al. | June 7, 1960 |